(12) United States Patent
Yoon (10) Patent No.: US 11,437,778 B2
(45) Date of Patent: Sep. 6, 2022

(54) WAVELENGTH TUNABLE LASER (71) Applicant: OE SOLUTIONS CO., LTD., Gwangju (KR)

(72) Inventor: Ki Hong Yoon, Daejeon (KR)

(73) Assignee: OE Solutions Co., Ltd., Gwangju (KR)

( * ) Notice: Subject to any disclaimer, the term of this patent is extended or adjusted under 35 U.S.C. 154(b) by 24 days.

(21) Appl. No.: 16/764,076

(22) PCT Filed: Nov. 28, 2017

(86) PCT No.: PCT/KR2017/013710
§ 371 (c)(1),
(2) Date: May 14, 2020

(87) PCT Pub. No.: WO2019/107580
PCT Pub. Date: Jun. 6, 2019

(65) Prior Publication Data
US 2020/0388989 A1    Dec. 10, 2020

(30) Foreign Application Priority Data
Nov. 28, 2017    (KR) .................. 10-2017-0159985

(51) Int. Cl.
*H01S 5/06*    (2006.01)
*H01S 5/042*    (2006.01)
(Continued)

(52) U.S. Cl.
CPC .......... *H01S 5/0612* (2013.01); *H01S 5/0261* (2013.01); *H01S 5/02453* (2013.01);
(Continued)

(58) Field of Classification Search
CPC .... H01S 5/0612; H01S 5/2086; H01S 5/2045; H01S 5/125; H01S 5/2081
See application file for complete search history.

(56) References Cited

U.S. PATENT DOCUMENTS 5,682,401 A * 10/1997 Joannopoulos ........ H01Q 13/28
372/96
5,866,918 A * 2/1999 Yamamoto ............ H01S 5/2231
257/13
(Continued)

FOREIGN PATENT DOCUMENTS

KR        10-1382522 B1    4/2014
KR    10-2015-0048017        5/2015
(Continued)

OTHER PUBLICATIONS

Office Action dated Dec. 28, 2018 in a corresponding Korean patent application No. 10-207-0159985, pp. 4.
(Continued)

*Primary Examiner* — Sean P Hagan (57) ABSTRACT

According to an embodiment, a wavelength tunable laser comprising a gain region and a wavelength tunable area is disclosed. The wavelength tunable area comprises: a lower clad layer; a passive optical waveguide positioned on the lower clad layer; an upper clad layer positioned on the passive optical waveguide; a drive electrode positioned on the upper clad layer; a current blocking layer positioned on the drive electrode; a heater positioned on the current blocking layer; and a first insulating groove and a second insulating groove which are positioned so as to face each other with the passive optical waveguide therebetween.

5 Claims, 6 Drawing Sheets

(51) Int. Cl.
  *H01S 5/024* (2006.01)
  *H01S 5/125* (2006.01)
  *H01S 5/0625* (2006.01)
  *H01S 5/026* (2006.01)
  *H01S 5/20* (2006.01)
  *H01S 5/12* (2021.01)
  *H01S 5/343* (2006.01)

(52) U.S. Cl.
  CPC ...... *H01S 5/04256* (2019.08); *H01S 5/06256* (2013.01); *H01S 5/125* (2013.01); *H01S 5/2045* (2013.01); *H01S 5/2086* (2013.01); *H01S 5/1209* (2013.01); *H01S 5/34313* (2013.01); *H01S 5/34326* (2013.01)

(56) References Cited

U.S. PATENT DOCUMENTS

| | | | | |
|---|---|---|---|---|
| 2003/0025976 | A1* | 2/2003 | Wipiejewski | G02F 1/011 359/240 |
| 2005/0141581 | A1* | 6/2005 | Kondo | H01S 5/42 372/68 |
| 2005/0169566 | A1* | 8/2005 | Takahashi | G02F 1/011 385/1 |
| 2009/0041073 | A1* | 2/2009 | Matsui | H01S 5/06256 372/34 |
| 2012/0051386 | A1* | 3/2012 | Kim | H01S 5/06258 372/96 |
| 2014/0321488 | A1* | 10/2014 | Chen | H01S 5/02461 438/694 |
| 2015/0117491 | A1 | 4/2015 | Lee et al. | |

FOREIGN PATENT DOCUMENTS

| | | |
|---|---|---|
| KR | 10-2016-0150247 | 12/2016 |
| KR | 10-2017-0055902 | 5/2017 |

OTHER PUBLICATIONS

Written Opinion of International Search Report dated Aug. 27, 2018 in PCT/KR2017/013710, pp. 4.

* cited by examiner

WAVELENGTH TUNABLE LASER

TECHNICAL FIELD

One embodiment of the present invention relates to a wavelength tunable laser.

BACKGROUND ART

Generally, when a laser light source which outputs a single wavelength is used, since as many laser light sources are required as the number of channels, wavelength resources cannot be efficiently used in an optical communication system.

Accordingly, optical communication systems such as dense wavelength division multiplexing (DWDM) and the like require a wavelength tunable laser to efficiently use wavelength resources.

Generally, a wavelength tunable laser has a single integration method of constituting a wavelength tunable laser in one chip, and an external resonance method of combining two or more chips after manufacturing the two or more chips.

The wavelength tunable laser in the single integration method is composed of the one chip and thus miniaturization and low power consumption are possible, but the wavelength tunable laser in the external resonance method is disadvantageous in that a large amount of power is required and the volume increases.

The wavelength tunable laser can include a gain region for generating light and a wavelength tunable region for wavelength tuning. As a method of tuning a wavelength of semiconductor laser, there are a method of applying current and a method of applying heat using a micro-heater.

In the case of the method of applying heat among the above, since a large voltage should be applied to adjust light of a single wavelength band to a desired wavelength, there is a disadvantage in that thermal efficiency for tuning the wavelength is low.

After inserting an etch prevention layer (for example, an indium gallium arsenide (InGaAs) layer) in a semiconductor laser chip to increase the thermal efficiency for tuning the wavelength, an insulating groove can be formed in the wavelength tunable region by selectively etching even the etch prevention layer. However, since the etch prevention layer is present in all regions (specifically, the gain region) in the laser, there is a problem in that the characteristics of the laser are degraded.

Further, in the conventional structure, since only one of the method of applying current and the method of applying heat can be selectively used as a method of tuning the wavelength, there is a problem in that the range of selection is narrow.

DISCLOSURE

Technical Problem

An embodiment is directed to providing a wavelength tunable laser without an etch prevention layer which forms an insulating groove.

An embodiment is directed to providing a wavelength tunable laser to which both a method of applying heat and a method of applying current are applicable.

Problems to be solved by the present invention are not limited to the above-described problems, and purposes and effects understood from solutions and embodiments which will be described below are also included.

Technical Solution

One aspect of the present invention provides a wavelength tunable laser including: a gain region; and a wavelength tunable region, wherein the wavelength tunable region includes a lower clad layer, a passive optical waveguide disposed on the lower clad layer, an upper clad layer disposed on the passive optical waveguide, a drive electrode disposed on the upper clad layer, a current blocking layer disposed on the drive electrode, a heater disposed on the current blocking layer, and a first insulating groove and a second insulating groove which are disposed opposite to each other with the passive optical waveguide therebetween.

The lower clad layer may include a protrusion portion formed by connection between the first insulating groove and the second insulating groove, the protrusion portion may have a first protrusion portion having a width which decreases in a second direction, and the second direction may be a direction from the upper clad layer toward the lower clad layer.

The protrusion portion may have a second protrusion portion having a width which increases in the second direction.

The second protrusion portion may be disposed under the first protrusion portion.

An area of the first protrusion portion may be larger than an area of the second protrusion portion.

A ratio between a first region having the greatest width and a second region having the smallest width in the protrusion portion may be 1:0.1 to 1:0.5.

A refractive index of the passive optical waveguide may be changed when current is input by the first electrode or heat is input by the heater.

Another aspect of the present invention provides a wavelength tunable laser including a gain region and a wavelength tunable region, wherein the wavelength tunable region includes a lower clad layer, a passive optical waveguide disposed between the lower clad layer, an upper clad layer disposed on the passive optical waveguide, a heater disposed on the upper clad layer, and a first insulating groove and a second insulating groove disposed on the lower clad layer, the first insulating groove and the second insulating groove are disposed opposite to each other with the passive optical waveguide therebetween, the lower clad layer includes a protrusion portion formed by connection between the first insulating groove and the second insulating groove, and the protrusion portion has a width which decreases in a direction away from the passive optical waveguide.

A lower edge angle of the protrusion portion may be 500 to 70°.

Advantageous Effects

According to an embodiment of the present invention, an insulating groove can be formed without a separate etch stop layer. Accordingly, there is an advantage in that low-power wavelength tuning is possible without degradation of performance of a wavelength tunable laser.

Further, since the etch stop layer is omitted, there is an advantage in that epitaxial growth is simplified, and a process for forming an insulating groove is simplified.

In addition, since the insulating groove is formed by adjusting only an etch rate of a semiconductor material, there is an advantage in that uniformity of a chip is guaranteed.

In addition, there is an advantage in that a wavelength can be adjusted by selective input of heat or current.

Various useful advantages and effects of the present invention are not limited to the above and may be relatively easily understood in a process of describing exemplary embodiments of the present invention.

MODES OF THE INVENTION

The embodiments may be modified into other forms or some of the embodiments may be combined, and the scope of the present invention is not limited to embodiments which will be described below.

Although items described in a specific embodiment are not described in another embodiment, the items may be understood as a description related to the other embodiment unless a description contrary to or contradicting the items is in the other embodiment.

For example, when a characteristic of a component A is described in a specific embodiment and a characteristic of a component B is described in another embodiment, the characteristics of the components are understood to fall within the scope of the present invention unless a contrary or contradictory description is present even when an embodiment in which the component A and the component B are combined is not clearly disclosed.

In the description of the embodiments, when one element is disclosed to be formed "on or under" another element, the term "on or under" includes both a case in which the two elements are in direct contact with each other and a case in which at least another element is disposed between the two elements (indirect contact). Further, when the term "on or under" is expressed, a meaning of not only an upward direction but also a downward direction with respect to one element may be included.

Hereinafter, embodiments of the present invention will be described in detail with reference to the accompanying drawings so that those skilled in the art may easily carry out the embodiment of the present invention.

In the embodiment, although the technical spirit of the present invention will be described on the basis of a single integration wavelength tunable laser, the spirit of the present invention is not limited to the single integration wavelength tunable laser and may also be applied to other types of wavelength tunable lasers.

Figure 1:
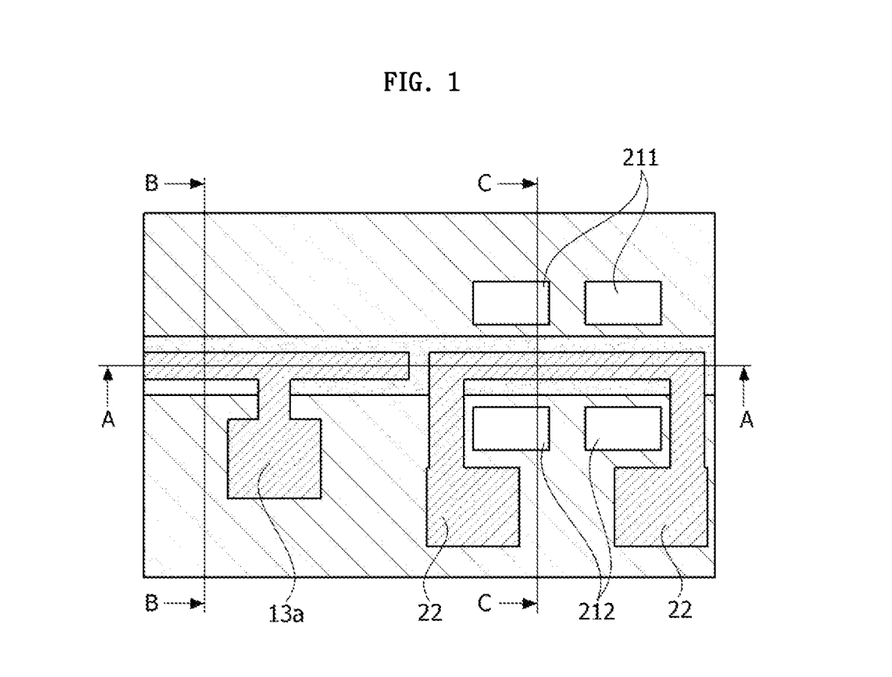
FIG. 1 is a plan view of a wavelength tunable laser according to one embodiment of the present invention.
Figure 2:
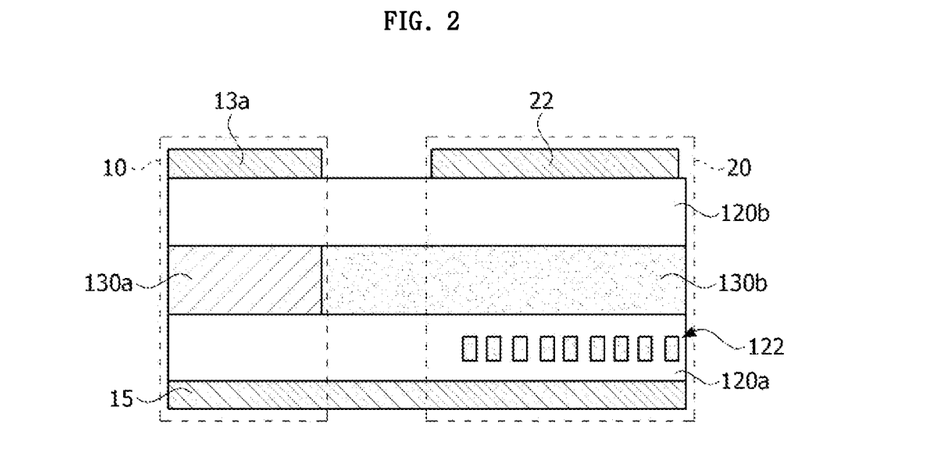
FIG. 2 is a cross-sectional view of the wavelength tunable laser according to one embodiment of the present invention.
Figure 3:
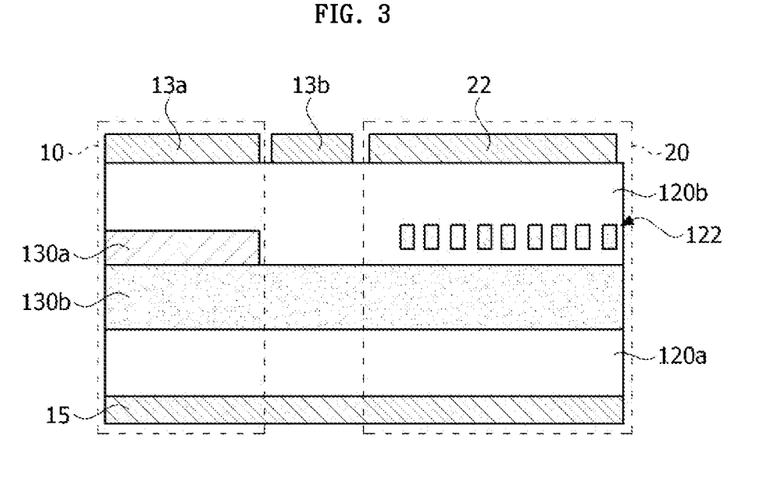
FIG. 3 is a modified example of FIG. 2.
Figure 4:
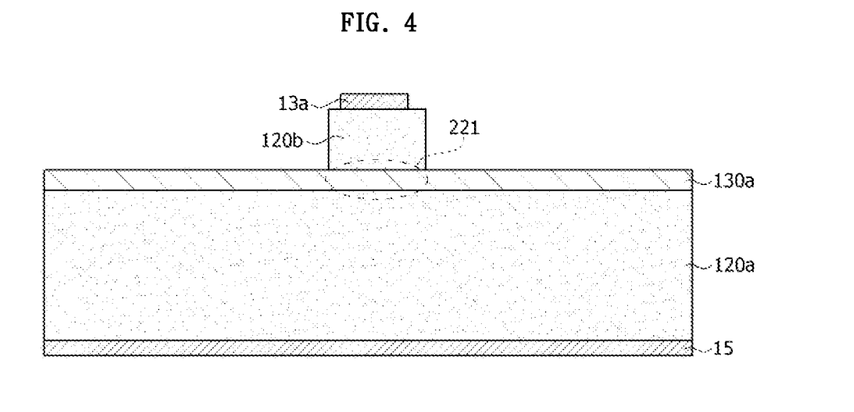
FIG. 4 is a cross-sectional view in direction B-B of FIG. 1.
Figure 5:
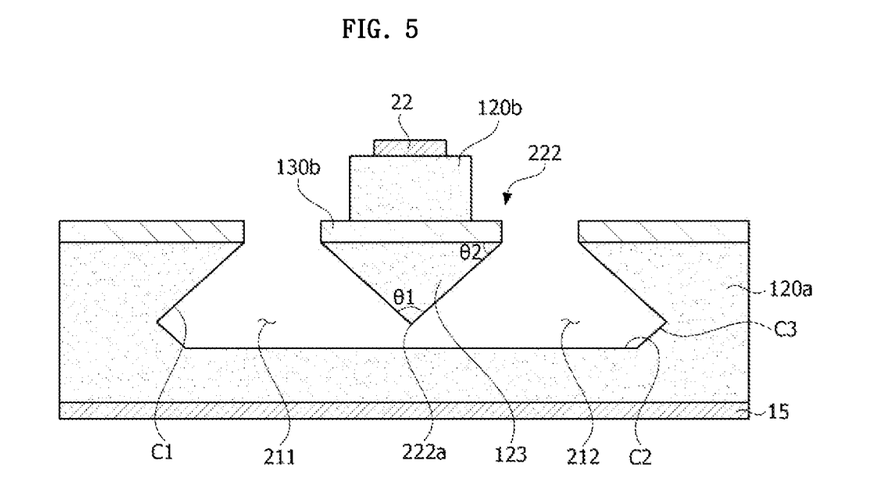
FIG. 5 is a cross-sectional view in direction C-C of FIG. 1.
Figure 6:
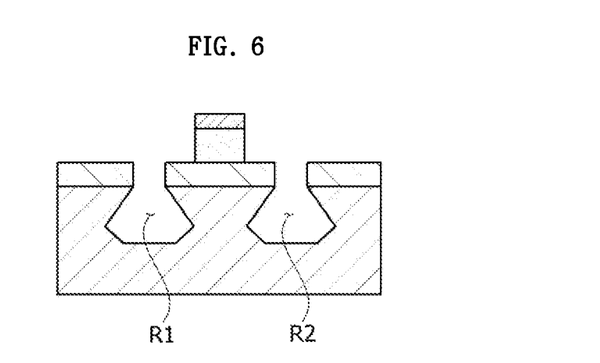
FIGS. 6 and 7 are views illustrating a process of forming an insulating groove in a lower clad layer.
Figure 7:
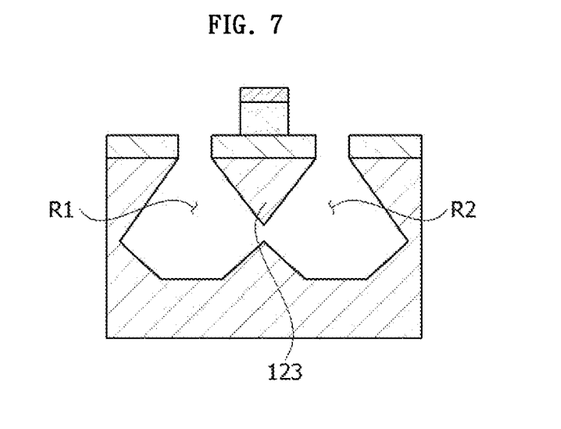

FIG. 1 is a plan view of a wavelength tunable laser according to one embodiment of the present invention, FIG. 2 is a cross-sectional view of the wavelength tunable laser according to one embodiment of the present invention, FIG. 3 is a modified example of FIG. 2, FIG. 4 is a cross-sectional view in direction B-B of FIG. 1, FIG. 5 is a cross-sectional view in direction C-C of FIG. 1, and FIGS. 6 and 7 are views illustrating a process of forming an insulating groove in a lower clad layer.

Referring to FIGS. 1 and 2, the wavelength tunable laser according to the embodiment may include a lower electrode 15, an upper clad layer 120$b$, a lower clad layer 120$a$, an optical waveguide 130, and a first electrode 13$a$.

The wavelength tunable laser may include a gain region 10 and a wavelength tunable region 20. The optical waveguide 130 may be classified into an optical waveguide disposed at the gain region 10 (hereinafter, an active optical waveguide) and an optical waveguide disposed at the wavelength tunable region 20 (a passive optical waveguide), and an active optical waveguide 130$a$ and a passive optical waveguide 130$b$ may be optically connected. For example, the active optical waveguide 130$a$ and the passive optical waveguide 130$b$ may be coupled to each other in a Butt-Joint manner or an integrated twin guide manner but are not limited thereto.

The gain region 10 may be produced by epitaxial growth of a plurality of semiconductor layers. A configuration of the plurality of semiconductor layers is not specifically limited. For example, a suitable composition ratio and doping concentration of the semiconductor layers of the gain region 10 may be adjusted to generate light in a desired wavelength range. For example, the active optical waveguide 130$a$ of the gain region 10 may have a multi-quantum well (MQW) structure in which a well layer and a barrier layer are alternately stacked. The composition of the well layer and the barrier layer may include indium aluminium gallium arsenide (InAlGaAs) or indium gallium arsenide phosphide (InGaAsP) but is not limited thereto.

The wavelength tunable region 20 may change a wavelength of light generated from the gain region 10. The wavelength tunable region 20 requires a wavelength tunable filter to tune the wavelength and may have a distributed Bragg reflector (DBR) structure 122 as an example. In the distributed Bragg reflector (DBR) structure 122, when heat or current is input, a refractive index of a diffraction grating changes to tune the wavelength.

In this case, the DBR structure 122 is shown as being disposed only at a front end of the gain region 10 but is not limited thereto, and a sampled-grating distributed Bragg reflector (SG-DBR) may be provided at each of front and rear ends of the gain region 10.

A first insulating groove 211 and a second insulating groove 212 may be disposed opposite to each other with the passive optical waveguide 130$b$ therebetween. That is, the passive optical waveguide 130$b$ may be disposed between the first insulating groove 211 and the second insulating groove 212 in a plan view. The first insulating groove 211 and the second insulating groove 212 may be disposed in plural but are not limited thereto.

The optical waveguide 130 may be disposed on the lower clad layer 120$a$, and the upper clad layer 120$b$ may be disposed on the optical waveguide 130. The upper clad layer 120b and the lower clad layer 120a may include indium phosphide (InP) but are not limited thereto.

The first electrode 13a may be disposed on the upper clad layer 120b. The first electrode 13a may generate light by applying current to the gain region 10. A heater 22 may adjust the wavelength of the light by applying heat to the passive optical waveguide 130b and changing the refractive index.

Referring to FIG. 3, the wavelength tunable laser according to the embodiment may have an integrated twin guide structure in which the active optical waveguide 130a is disposed on the passive optical waveguide 130b. Further, the DBR structure 122 may be disposed on the passive optical waveguide 130b. In addition, a sub electrode 13b may be further provided. The sub electrode 13b may be an electrode for at least one of phase control, heat control, and light control.

Referring to FIG. 4, the upper clad layer 120b may be disposed on a partial region of the active optical waveguide 130a. That is, the upper clad layer 120b may only be disposed on a waveguide mode 221 through an etching process. According to the embodiment, since the gain region does not have an etch prevention layer, the optical characteristic and/or electrical characteristic of the laser may be improved.

Referring to FIG. 5, in the wavelength tunable region, each of the first insulating groove 211 and the second insulating groove 212 may have a reverse mesa shape having a width which increases when becoming closer to the lower electrode 15. Further, the first insulating groove 211 and the second insulating groove 212 may be connected to each other in the lower clad layer 120a to form one groove surrounding the passive optical waveguide 130b. Each of the first insulating groove 211 and the second insulating groove 212 may have a separate insulating material disposed thereon but is not limited thereto.

Each of the first insulating groove 211 and the second insulating groove 212 may have a first section C1 having an area which gradually increases when becoming closer to the lower electrode 15, and a second section C3 having an area which gradually decreases when becoming closer to the lower electrode 15. A depth, area, and the like of each of the first section C1 and the second section C3 may be changed according to the type of an etching solution. Further, lower surfaces of the first insulating groove 211 and the second insulating groove 212 may have a flat surface C2.

The lower clad layer 120a may include a protrusion portion 123 surrounded by the first insulating groove 211 and the second insulating groove 212. The wavelength tunable region may include a control region 222 composed of the upper clad layer 120b, the passive optical waveguide 130b, and the protrusion portion 123 of the lower clad layer 120a. The control region 222 may be a region of which a refractive index is changed by input of heat. That is, the control region 222 may be a region which controls the wavelength.

The heater 22 may be disposed on the control region 222. The heater 22 may include at least one of metals including chrome (Cr), titanium (Ti), platinum (Pt), nickel (Ni), and gold (Au) but is not limited thereto.

Since some of the heat input from the heater 22 escapes to the lower clad layer 120a when the protrusion portion 123 of the control region 222 is connected to the lower clad layer 120a, efficiency of the heat applied to the passive optical waveguide 130b may be degraded.

However, in the embodiment, the heat transferred to the protrusion portion 123 may be blocked by the first insulating groove 211 and the second insulating groove 212. Accordingly, since variation of the refractive index of the passive optical waveguide 130b increases, a wavelength tunable range may increase. Further, input current may be reduced.

According to the embodiment, the first insulating groove 211 and the second insulating groove 212 may be formed by controlling an exposing time of the etching solution. When the etching solution capable of etching the lower clad layer 120a is selected, and an etching angle by the etching solution is determined, an etching depth and an etching time which may form the protrusion portion 123 may be calculated. Hbr or the like may be selected as the etching solution but is not limited thereto.

Referring to FIG. 6, when the lower clad layer 120a is etched for a first time using the etching solution, first and second insulating grooves R1 and R2 each having a first size may be formed. Hereinafter, as shown in FIG. 7, when the etching time is increased, the first and second insulating grooves R1 and R2 become gradually larger and, accordingly, may be connected to each other. Accordingly, the protrusion portion 123 may be formed. Since the etching angle of the etching solution is determined, the etching time for forming the protrusion portion may be calculated.

According to the embodiment, since the protrusion portion 123 is formed only by adjusting an etch rate of the etching solution, an etch stop layer (for example, an indium gallium arsenide (InGaAs) layer) which ends etching may be omitted. Accordingly, the epitaxial growth may be simplified and laser efficiency may be improved.

Figure 8:
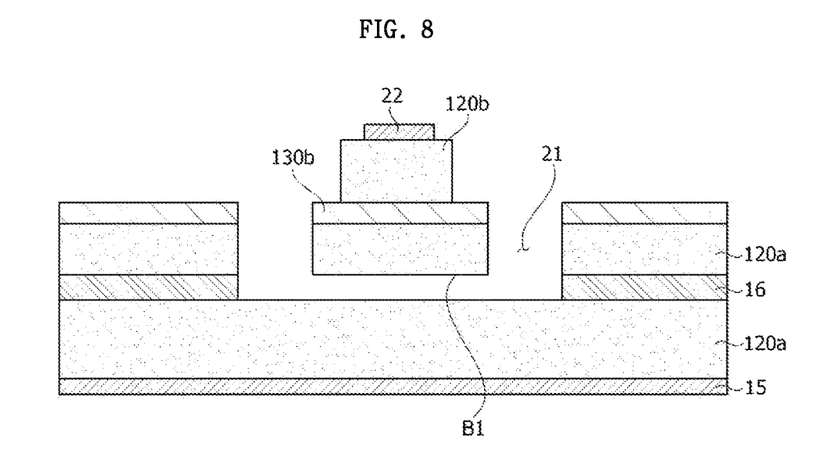
FIG. 8 is a cross-sectional view of a wavelength tunable region of a conventional wavelength tunable laser.
Figure 9:
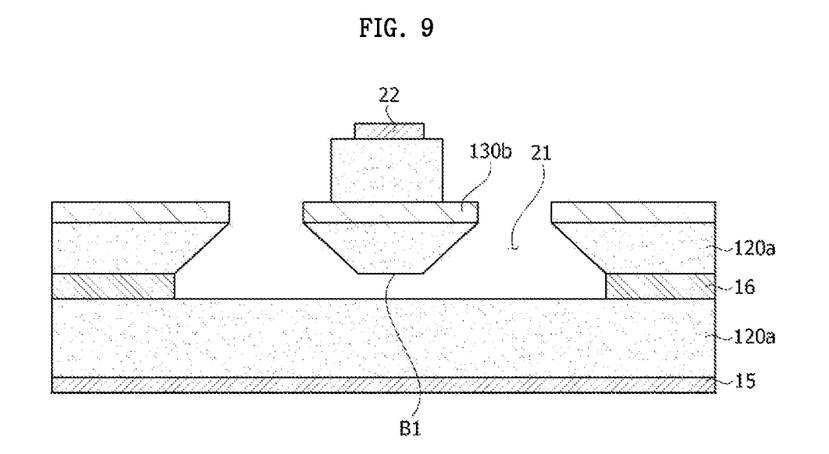
FIG. 9 is a modified example of FIG. 8.
Figure 10:
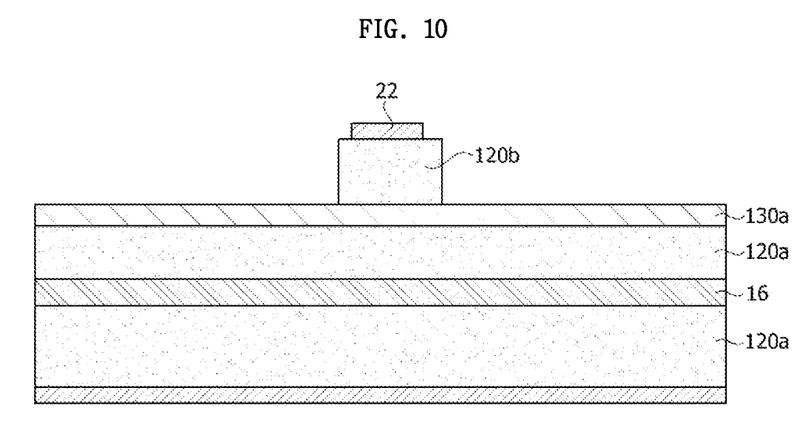
FIG. 10 is a cross-sectional view of a gain region of the conventional wavelength tunable laser.
Figure 11:
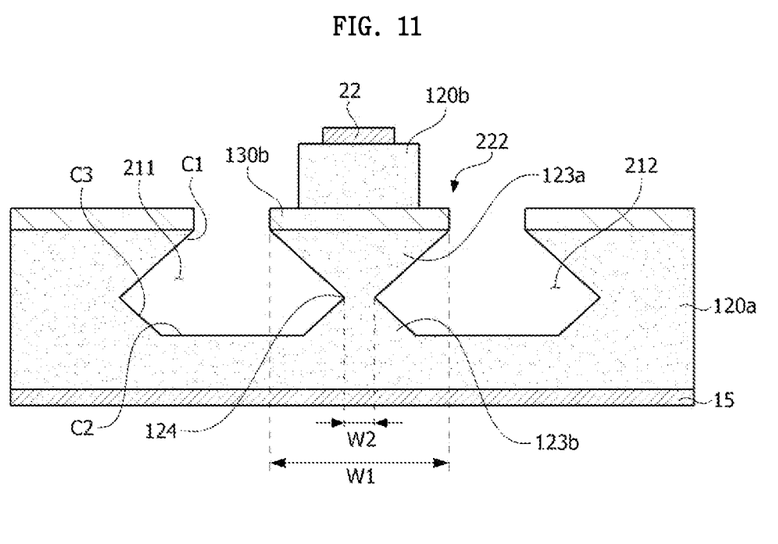
FIG. 11 is a modified example of FIG. 5.

FIG. 8 is a cross-sectional view of a wavelength tunable region of a conventional wavelength tunable laser, FIG. 9 is a modified example of FIG. 8, FIG. 10 is a cross-sectional view of a gain region of the conventional wavelength tunable laser, and FIG. 11 is a modified example of FIG. 5.

Referring to FIG. 8, a separate etch stop layer 16 may be disposed on the lower clad layer 120a of the wavelength tunable region 20. In this case, the insulating groove 21 may be finally formed by etching the clad layer to the etch stop layer 16 and then removing the etch stop layer 16 again. Accordingly, two-step etching is required. In this case, as shown in FIG. 9, the insulating groove may be formed in a reverse mesa structure.

However, as shown in FIG. 10, in a single integration structure, since the gain region 10 and the wavelength tunable region 20 have the same epi structure, there is a problem in that the gain region 10 is inevitably in has the etch stop layer 16. Accordingly, the etch stop layer 16 remains in the gain region 10, and thus characteristic degradation of the laser may be caused. Further, there is a problem in that an epi manufacturing process may be complicated.

However, according to the embodiment, since the control region 222 is formed only by adjusting the etch rate of the etching solution, the etch stop layer which ends the etching may be omitted. Accordingly, the epitaxial growth may be simplified and the laser efficiency may be improved.

Referring to FIG. 5 again, a width of the protrusion portion 123 according to the embodiment may decrease in a downward direction. In this case, a cross-section of the protrusion portion 123 may be a triangular shape but is not limited thereto.

The protrusion portion 123 having a triangular cross-section may include a first edge 222a most adjacent to the lower electrode 15. In this case, a first angle θ1 of the first edge 222a may be 30 to 70°. The first angle θ1 and a second angle θ2 of the first edge may be determined by the etching angle of the etching solution.

However, since the conventional structure having the etch stop layer is a structure which etches only a portion of the clad layer and then removes the etch stop layer again, a lower surface of the control region 222 is not sharp and may have a flat surface (B1 in FIGS. 8 and 9). The flat surface may not be advantageous from a viewpoint of thermal efficiency.

Referring to FIG. 11, the first insulating groove 211 and the second insulating groove 212 according to the embodiment may not be connected to each other in the lower clad layer 120a. That is, the protrusion portion 123 of the control region 222 may be connected to the lower clad layer 120a.

The protrusion portion 123 may include a first protrusion portion 123a having a width which decreases in a downward direction and a second protrusion portion 123b having a width which increases in a downward direction. According to the above-described structure, since the second protrusion portion 123b supports the first protrusion portion 123a, the control region 222 may be stably driven. Specifically, when a separate insulating material is not disposed on each of the first insulating groove 211 and the second insulating groove 212, the supporting structure may be more effective.

An area of the first protrusion portion 123a may be greater than an area of the second protrusion portion 123b. However, the present invention is not limited thereto, and the area of the first protrusion portion 123a may be smaller than or equal to the area of the second protrusion portion 123b. That is, the heights and areas of the first protrusion portion 123a and the second protrusion portion 123b may be changed according to the type of the etching solution.

In the protrusion portion 123 a ratio (W1:W2) between a first region W1 having the greatest width and a second region W2 having the smallest width may be 1:0.1 to 1:0.5. The first region W1 having the greatest width may be an upper surface of the first protrusion portion 123a, and the second region W2 having the smallest width may be a boundary 124 between the first protrusion portion 123a and the second protrusion portion 123b.

When the ratio is smaller than 1:0.1, the width of the second region W2 becomes too small and thus it may be difficult to stably support the first protrusion portion 123a. Further, when the ratio is greater than 1:0.5, heat loss through the second region W2 increases. For example, the width of the second region W2 may be 0.1 m to 0.5 m but is not limited thereto.

Figure 12:
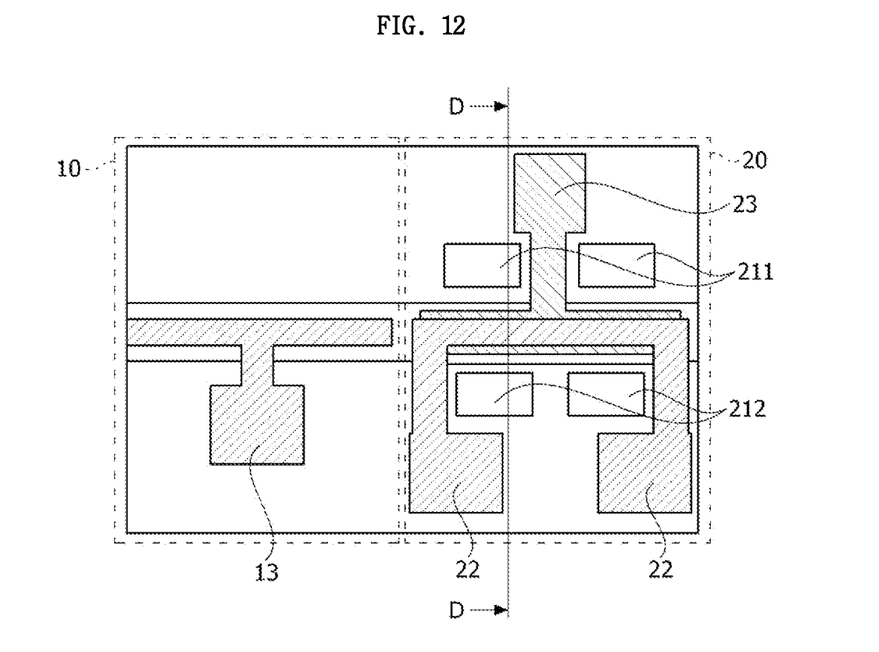
FIG. 12 is a plan view of a wavelength tunable laser according to another embodiment of the present invention.
Figure 13:
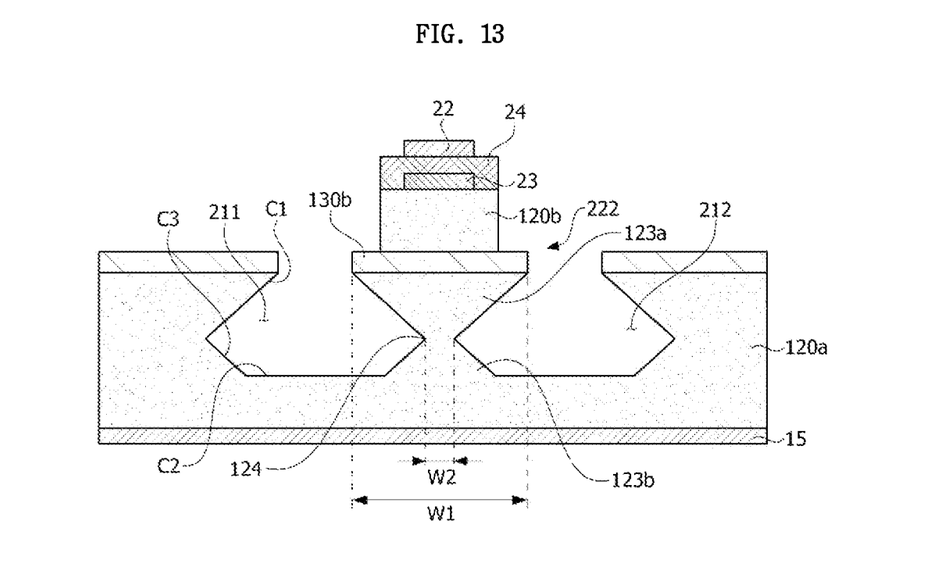
FIG. 13 is a cross-sectional view in direction D-D of FIG. 12.

FIG. 12 is a plan view of a wavelength tunable laser according to another embodiment of the present invention, FIG. 13 is a cross-sectional view in direction D-D of FIG. 12, and FIGS. 12 and 13 are views illustrating a state in which an etching region of a reflection layer increases when an etching time increases.

Referring to FIGS. 12 and 13, the wavelength tunable laser may include a gain region 10 and a wavelength tunable region 20. An optical waveguide 130 may be classified into an optical waveguide disposed at the gain region 10 (hereinafter, an active optical waveguide) and an optical waveguide disposed at the wavelength tunable region 20 (a passive optical waveguide), and an active optical waveguide 130a and a passive optical waveguide 130b may be optically connected. For example, the active optical waveguide 130a and the passive optical waveguide 130b may be coupled to each other in an integrated twin guide manner or a Butt-Joint manner but are not limited thereto.

Referring to FIG. 13, the wavelength tunable region 20 may include the passive optical waveguide 130b disposed on a lower clad layer 120a, an upper clad layer 120b disposed on the passive optical waveguide 130b, a third electrode 23 disposed on the upper clad layer 120b, a current blocking layer 24 disposed on the third electrode 23, a heater 22 disposed on the current blocking layer 24, and a first insulating groove 211 and a second insulating groove 212 which are disposed opposite to each other with the passive optical waveguide 130b therebetween.

The first insulating groove 211 and the second insulating groove 212 according to the embodiment may be formed to a partial region of the lower clad layer 120a. In this case, the first insulating groove 211 and the second insulating groove 212 may not be connected to each other in the lower clad layer 120a. That is, a protrusion portion 123 of a control region 222 may be connected to the lower clad layer 120a. Accordingly, refractive index control according to input current may be possible.

The protrusion portion 123 may include a first protrusion portion 123a having a width which decreases in a downward direction and a second protrusion portion 123b having a width which increase in the downward direction. According to the above-described structure, since the second protrusion portion 123b supports the first protrusion portion 123a, the control region may be stably driven. Specifically, when a separate insulating material is not disposed on each of the first insulating groove 211 and the second insulating groove 212, the supporting structure may be more effective. Heights of the first protrusion portion 123a and the second protrusion portion 123b may be changed according to the type of the etching solution.

The third electrode (drive electrode) 23 may be disposed on the upper clad layer 120b. When current is input into the third electrode 23 and a lower electrode 15, a refractive index of the passive optical waveguide 130b is changed and thus a wavelength may be tuned. The current blocking layer 24 may be disposed between the third electrode 23 and the heater 22.

According to the embodiment, the wavelength may be tuned by applying heat of the heater 22 to the control region 222 to change the refractive index of the passive optical waveguide 130b, and the wavelength may also be tuned by inputting 5 the current to change the refractive index of the passive optical waveguide 130b.

That is, for tuning of the wavelength, the current may be input to the third electrode 23 or a voltage may be applied to the heater 22. According to the embodiment, only the heater 22 may be controlled to control the wavelength in a heat application manner, and the current may be input to the third electrode 23 to control the wavelength in a current application manner.

However, the present invention is not limited thereto, and the heat and the current may be simultaneously applied by both applying the voltage to the heater 22 and inputting the current to the third electrode 23. In this case, since the refractive index may be controlled by both the heat and the current, a tunable range of the wavelength may increase.

In the protrusion portion 123 a ratio (W1:W2) between a first region W1 having the greatest width and a second region W2 having the smallest width may be 1:0.1 to 1:0.5. When the ratio is smaller than 1:0.1, the width of the second region W2 becomes too small and thus it may be difficult to stably support the first protrusion portion 123a. Further, the width of the second region W2 becomes too small and thus a resistance increases when the currents by the third electrode 23 are applied.

When the ratio is greater than 1:0.5, heat loss through the second region W2 increases. For example, in order to prevent the waveguide mode from being affected by the insulating groove, the first region W1 may be roughly 10 m or more. Further, the width of the second region 124 may be 0.1 m to 0.5 m but is not limited thereto.

Although the above-described embodiments are mainly described with reference to the embodiments of the present invention, the above are only exemplary, and it should be understood that those skilled in the art may variously perform modifications and applications within the principle of the embodiments. For example, elements specifically shown in the embodiments may be modified. Further, differences related to modifications and changes should be understood as being included in the scope of the present invention defined in the appended claims.

The invention claimed is:

1. A wavelength tunable laser configured for wavelength tuning by selective input of heat or current, the wavelength tunable laser comprising:
   a gain region; and
   a wavelength tunable region,
   wherein the wavelength tunable region includes:
      a lower clad layer,
      a passive optical waveguide disposed on the lower clad layer,
      an upper clad layer disposed on the passive optical waveguide,
      a drive electrode disposed on the upper clad layer,
      a current blocking layer disposed on the drive electrode,
      a heater disposed on the current blocking layer,
   a first insulating groove and a second insulating groove, the first insulating groove and the second insulating groove being formed in the lower clad layer without an etch stop layer and disposed opposite to each other with the passive optical waveguide disposed therebetween, and
   a protrusion portion disposed in the lower clad layer, the protrusion portion separating the first insulating groove and the second insulating groove,
   wherein the protrusion portion comprises a first protrusion portion having a width and a cross-sectional area and a second protrusion portion having a width and a cross-sectional area, and the first protrusion portion is configured to abut the second protrusion portion,
   wherein the width of the first protrusion portion linearly decreases in a first direction from the upper clad layer to the lower clad layer and the width of the second protrusion portion linearly increases in the first direction,
   wherein the cross-sectional area of the first protrusion portion is larger than the cross-sectional area of the second protrusion portion, and
   wherein the heater and the drive electrode each are configured to change a wavelength of the wavelength tunable region.

2. The wavelength tunable laser of claim 1, wherein a ratio between the greatest width W1 of the first protrusion portion and the smallest width W2 of the first protrusion portion is 1:0.1 to 1:0.5.

3. The wavelength tunable laser of claim 1, wherein a refractive index of the passive optical waveguide is changed when currents are input by the drive electrode or heat is input by the heater.

4. The wavelength tunable laser of claim 1, wherein the first protrusion portion of the protrusion portion has an inverted trapezoidal shape.

5. The wavelength tunable laser of claim 1, wherein the first insulating groove and the second insulating groove are formed by adjusting only an etch rate of a semiconductor material.

* * * * *